United States Patent
Mitzi et al.

(10) Patent No.: US 8,642,884 B2
(45) Date of Patent: Feb. 4, 2014

(54) HEAT TREATMENT PROCESS AND PHOTOVOLTAIC DEVICE BASED ON SAID PROCESS

(75) Inventors: David Brian Mitzi, Mahopac, NY (US); Teodor Krassimirov Todorov, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 17 days.

(21) Appl. No.: 13/228,983

(22) Filed: Sep. 9, 2011

(65) Prior Publication Data
US 2013/0061903 A1  Mar. 14, 2013

(51) Int. Cl.
*H01L 31/18* (2006.01)
*H01L 31/0328* (2006.01)

(52) U.S. Cl.
USPC .......... 136/256; 136/265; 136/262; 136/264; 136/252; 438/95; 257/E31.005

(58) Field of Classification Search
USPC ........... 136/256, 265, 262, 264, 252; 438/95; 257/E31.005
See application file for complete search history.

(56) References Cited

U.S. PATENT DOCUMENTS

| | | | | |
|---|---|---|---|---|
| 4,915,745 A * | 4/1990 | Pollock et al. | | 136/265 |
| 5,141,564 A * | 8/1992 | Chen et al. | | 136/258 |
| 5,626,688 A * | 5/1997 | Probst et al. | | 136/265 |
| 6,310,281 B1 * | 10/2001 | Wendt et al. | | 136/256 |
| 6,323,417 B1 * | 11/2001 | Gillespie et al. | | 136/262 |
| 6,429,369 B1 * | 8/2002 | Tober et al. | | 136/265 |
| 6,518,086 B2 * | 2/2003 | Beck et al. | | 438/95 |
| 6,974,976 B2 * | 12/2005 | Hollars | | 257/184 |
| 7,122,398 B1 | 10/2006 | Pichler | | |
| 7,582,506 B2 | 9/2009 | Basol | | |
| 7,605,328 B2 | 10/2009 | Sager et al. | | |
| 2004/0144419 A1 * | 7/2004 | Fix et al. | | 136/252 |
| 2005/0006221 A1 * | 1/2005 | Takeuchi et al. | | 204/192.1 |
| 2007/0163644 A1 * | 7/2007 | Van Duren et al. | | 136/262 |
| 2007/0257255 A1 * | 11/2007 | Dhere et al. | | 257/40 |
| 2009/0035882 A1 * | 2/2009 | Basol | | 438/16 |
| 2009/0145482 A1 | 6/2009 | Mitzi et al. | | |
| 2009/0320916 A1 | 12/2009 | Yuan et al. | | |

(Continued)

OTHER PUBLICATIONS

Basic Research Needs for Solar Energy Utilization, Report of the Basic Energy Sciences Workshop on Solar Energy Utilization Apr. 18-21, 2005, U.S. Dept. of Energy, Office of Science.

(Continued)

*Primary Examiner* — Golam Mowla
(74) *Attorney, Agent, or Firm* — Vazken Alexanian; Michael J. Chang, LLC

(57) ABSTRACT

Low-temperature sulfurization/selenization heat treatment processes for photovoltaic devices are provided. In one aspect, a method for fabricating a photovoltaic device is provided. The method includes the following steps. A substrate is provided that is either (i) formed from an electrically conductive material or (ii) coated with at least one layer of a conductive material. A chalcogenide absorber layer is formed on the substrate. A buffer layer is formed on the absorber layer. A transparent front contact is formed on the buffer layer. The device is contacted with a chalcogen-containing vapor having a sulfur and/or selenium compound under conditions sufficient to improve device performance by filling chalcogen vacancies within the absorber layer or the buffer layer or by passivating one or more of grain boundaries in the absorber layer, an interface between the absorber layer and the buffer layer and an interface between the absorber layer and the substrate.

17 Claims, 4 Drawing Sheets

(56) References Cited

U.S. PATENT DOCUMENTS

2010/0248419 A1 9/2010 Woodruff et al.
2011/0094557 A1 4/2011 Mitzi et al.
2011/0097496 A1 4/2011 Mitzi et al.

OTHER PUBLICATIONS

Goushi et al., "Fabrication of Pentanary Cu(InGa)(SeS)2 Absorbers by Selenization and Sulfurization," Solar Energy Materials and Solar Cells, vol. 93, No. 8, pp. 1318-1320 (2009).

Kronik et al., "Effects of Sodium on Polycrystalline Cu(In,Ga)Se2 and Its Solar Cell Performance," Advanced Materials, vol. 10, No. 1, pp. 31-36 (1998).

Cahen et. al., "Defect Chemical Explanation for the Effect of Air Anneal on CdS/CuInSe2 Solar Cell Performance" Appl. Phys. Lett., vol. 54, pp. 558-560 (1989).

Rau et al., "Oxygenation and Air-Annealing Effects on the Electronic Properties of Cu(In,Ga)Se2 Films and Devices," J. Applied Physics, vol. 86, No. 1, pp. 497-505 (1999).

Sasala et al., "Annealing Effects on Individual Loss Mechanisms in CuInSe2 Solar Cells," Solar Cells, vol. 30, pp. 101-107 (1991).

Rau et al., "Electronic Properties of ZnO/CdS/Cu(In,Ga)Se2 Solar Cells—Aspects of Heterojunction Formation," Thin Solid Films, vol. 387, pp. 141-146 (2001).

Steudel et al., "Speciation and Thermodynamics of Sulfur Vapor," in Topics in Current Chemistry pp. 117-134 (vol. 230), Springer Berlin/Heidelberg (2003).

Powalla et al., "Large-Area CIGS Modules: Pilot Line Production and New Developments," International PVSEC-14, Bangkok, Thailand, Jan. 26-30, 2004; IN28V/18-1.

D.B. Mitzi et al., "A High-Efficiency Solution-Deposited Thin-Film Photovoltaic Device," Adv. Mater. 20, pp. 3657-3662 (2008).

T. Todorov et al., "High-Efficiency Solar Cell with Earth-Abundant Liquid-Processed Absorber," Adv. Mater. 22, E156-E159 (2010).

D.B. Mitzi "Solution Processing of Chalcogenide Semiconductors via Dimensional Reduction," Adv. Mater., 21, 3141-3158 (2009).

V. Chawla et al., "Inexpensive, Abundant, Non-Toxic Thin Films for Solar Cell Applications Grown by Reactive Sputtering," 35th IEEE Photovoltaic Specialists Conference (PVSC), Honolulu, HI (Jun. 20-25, 2010) pp. 001902-001905.

T. Dullweber et al., "Back Surface Band Gap Gradings in Cu(In,Ga)Se2 Solar Cells," Thin Solid Films 387, 11-13 (2001).

D.B. Mitzi et al., "The Path Towards a High-Performance Solution-Processed Kesterite Solar Cell," Solar Energy Materials & Solar Cells (2011).

M.V. Yakushev et al., "Effects of D* Implantation on the Properties of CdS\CIGS and ZnO\CdS\CIGS Heterostructures," IEEE pp. 571-574 (2000).

* cited by examiner

| CELL | TREATMENT STEPS | Eff (%) | FF (%) | Voc (mV) | Jsc (mA/cm$^2$) | R-Jsc (Ω) | R-Voc (Ω) |
|---|---|---|---|---|---|---|---|
| A | 1) AIR ANNEAL | 12.17 | 70.14 | 594.7 | 29.176 | 2311 | 5.103 |
|   | 2) S-ANNEAL | 13.43 | 73.42 | 603.4 | 30.325 | 2413 | 4.216 |
|   | 3) S-AN + M$_g$F$_2$ COATING | 14.34 | 73.32 | 602.4 | 32.471 | 2152 | 4.004 |
| B | 1) NONE | 7.50 | 45.43 | 578.1 | 28.575 | 1170 | 24.328 |
|   | 2) S-ANNEAL | 13.10 | 72.93 | 600.9 | 29.898 | 3511 | 4.214 |
|   | 3) S-AN + M$_g$F$_2$ COATING | 14.32 | 73.56 | 607.3 | 32.071 | 3125 | 4.104 |

| CELL | TREATMENT STEPS | Eff (%) | FF (%) | Voc (mV) | Jsc (mA/cm$^2$) | R-Jsc (Ω) | R-Voc (Ω) |
|---|---|---|---|---|---|---|---|
| C | AS DEPOSITED | 5.06 | 39.4 | 478 | 26.8 | 544 | 23 |
|   | H$_2$S anneal | 8.52 | 65.3 | 485 | 26.8 | 1555 | 5.5 |
| D | AS DEPOSITED | 5.09 | 49.3 | 481 | 21.4 | 1077 | 19 |
|   | AIR ANNEAL | 6.82 | 57.8 | 496 | 23.7 | 966 | 11 |

800

| CELL | TREATMENT STEPS | Eff (%) | FF (%) | Voc (mV) | Jsc (mA/cm$^2$) | R-Jsc ($\Omega$) | R-Voc ($\Omega$) |
|---|---|---|---|---|---|---|---|
| E | AS DEPOSITED | 5.987 | 49.577 | 479.388 | 25.193 | 866.9 | 15.837 |
|   | H$_2$Se ANNEAL | 8.488 | 66.768 | 492.123 | 25.832 | 1174 | 5.709 |

900

HEAT TREATMENT PROCESS AND PHOTOVOLTAIC DEVICE BASED ON SAID PROCESS

FIELD OF THE INVENTION

The present invention relates to photovoltaic devices (e.g., solar cells) and more particularly, to low-temperature sulfurization/selenization heat treatment processes for photovoltaic devices and photovoltaic devices produced using these processes.

BACKGROUND OF THE INVENTION

World demand for energy is expected to more than double by the year 2050 and to more than triple by the end of the century. Incremental improvements in existing energy technologies will not be adequate to supply this demand in a sustainable way. Sunlight represents by far the largest of all carbon-neutral potential energy sources. More energy from sunlight strikes the earth in one hour than all of the energy consumed on the planet in one year. However, currently, less than 0.1% of the world's electricity is generated using solar electricity generation. See "Basic Research Needs for Solar Energy Utilization, Report of the Basic Energy Sciences Workshop on Solar Energy Utilization" Apr. 18-21, 2005, U.S. Dept. of Energy, Office of Science.

The reason for the lack of widespread adoption of photovoltaic technology is directly linked with the high cost/watt of this technology. Industrial electricity today costs, on average, about 0.09$/kilowatt hour (kWh) in the United States. Solar electricity costs vary between approximately 0.2-0.5 $/kWh depending upon the system and climate. For photovoltaic technology to be competitive without subsidies, there consequently must be at least a 2-6× reduction in the cost per kWh. Improving on cost/watt for solar technology has two components: 1) reducing the cost of fabricating the device and 2) increasing the power conversion efficiency of the resulting device.

A substantial fraction of today's photovoltaic production is silicon (Si)-based. High efficiencies (i.e., greater than 20% in laboratory-scale devices) in single junction cells are only achieved in thick crystalline silicon devices. Due to the indirect band gap, which necessitates the thick absorber layer, and the associated high-temperature vacuum-based processing, Si is not an ideal material for an absorber layer as a result of the high materials and processing costs.

An alternative approach is to look at thin-film direct band gap absorber layers (rather than Si), which are typically metal chalcogenides offering a very high absorptivity for solar photons. The two principal metal-chalcogenide-based thin-film technologies are CdTe and $Cu(In,Ga)Se_2$ (CIGS). CdTe cells with 16.5% efficiency and CIGS cells with 20.3% efficiency have been made. More recently, $Cu_2ZnSn(S,Se)_4$ (CZTSSe) devices have also been demonstrated with efficiencies approaching 10%. Often these materials can be deposited using low-temperature solution-based approaches, which are expected to be lower-cost than typical vacuum-based approaches. Photovoltaic devices based on chalcogenide absorber layers therefore offer substantial promise of being able to reduce materials and processing costs for solar technology. Devices based on CIGS and CZTSSe are particularly desirable because of the avoidance of the heavy metal Cd in the relatively thick absorber layer. Besides the cost of fabrication, achieving high efficiency in the thin-film chalcogenide-based solar cells is crucial for achieving low $/watt or $/kWh.

Therefore, cost-effective techniques for producing high efficiency photovoltaic devices would be desirable.

SUMMARY OF THE INVENTION

The present invention provides low-temperature sulfurization/selenization heat treatment processes for photovoltaic devices. In one aspect of the invention, a method for fabricating a photovoltaic device is provided. The method includes the following steps. A substrate is provided that is either (i) formed from an electrically conductive material or (ii) coated with at least one layer of a conductive material. A chalcogenide absorber layer is formed on the substrate. A buffer layer is formed on the absorber layer. A transparent front contact is formed on the buffer layer. The device is contacted with a chalcogen-containing vapor having at least one of a sulfur compound and a selenium compound under conditions sufficient to improve device performance by filling chalcogen vacancies within the absorber layer or the buffer layer or by passivating one or more of grain boundaries in the absorber layer, an interface between the absorber layer and the buffer layer and an interface between the absorber layer and the substrate.

A more complete understanding of the present invention, as well as further features and advantages of the present invention, will be obtained by reference to the following detailed description and drawings.

BRIEF DESCRIPTION OF THE DRAWINGS

FIG. 6 is a table illustrating performance of solar cell samples that include solar cells prepared using the present heat treatment in the presence of elemental sulfur vapor according to an embodiment of the present invention;

FIG. 7 is a table illustrating performance of solar cell samples that include solar cells prepared using the present heat treatment in the presence of hydrogen sulfide vapor according to an embodiment of the present invention;

DETAILED DESCRIPTION OF PREFERRED EMBODIMENTS

Figure 1:
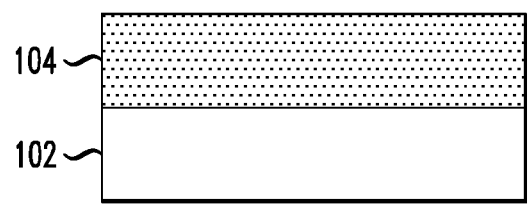
FIG. 1 is a cross-sectional diagram illustrating a starting structure for fabricating a photovoltaic device, i.e., a conductive back contact layer(s) coated on a substrate according to an embodiment of the present invention.

Provided herein are techniques for improving the power conversion efficiency of thin-film chalcogenide-based photovoltaic devices (e.g., solar cells) using a simple low-cost process. FIGS. 1-5 illustrate an exemplary methodology for fabricating a photovoltaic device using the present techniques. As shown in FIG. 1, a starting structure for the fabrication process is a substrate 102 coated with a layer 104 (or optionally multilayers represented generally by layer 104) of an electrically conductive material. Suitable substrates include, but are not limited to, glass, metal foil or plastic substrates. Suitable materials for use in forming conductive layer 104 include, but are not limited to, molybdenum (Mo), nickel (Ni), tantalum (Ta), tungsten (W), aluminum (Al) and combinations comprising at least one of the foregoing materials (e.g., as an alloy or as multilayers). According to an exemplary embodiment, conductive layer 104 is formed from Mo that is coated on substrate 104 using sputtering to a thickness of from about 0.1 micrometers ($\mu m$) to about 1 $\mu m$. Conductive layer 104 will serve as a back contact of the device.

In general, the various layers of the solar cell will be deposited sequentially using a combination of vacuum-based and/or solution-based approaches. See, for example, U.S. Patent Application Publication No. 2009/0145482A1, filed by Mitzi et al., entitled, "Photovoltaic Device with Solution-Processed Chalcogenide Absorber Layer" (a solution-based approach), U.S. Patent Application Publication No. 2009/0320916A1, filed by Yuan et al., entitled, "Techniques for Enhancing Performance of Photovoltaic devices" (a solution-based or vacuum-based approach), U.S. Patent Application Publication No. 2011/0094557 A1, filed by Mitzi et al., entitled "Method of Forming Semiconductor Film and Photovoltaic Device Including the Film," (hereinafter "U.S. Patent Application Publication No. 2011/0094557 A1") and U.S. Patent Application Publication No. 2011/0097496A1, filed by Mitzi et al., entitled "Aqueous-Based Method of Forming Semiconductor Film and Photovoltaic Device Including the Film," (hereinafter "U.S. Patent Application Publication No. 2011/0097496 A1"). The contents of each of the foregoing patent applications are incorporated by reference herein.

Figure 2:
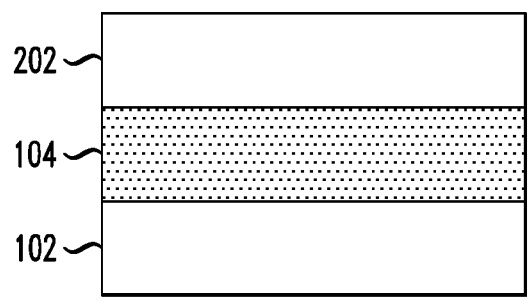
FIG. 2 is a cross-sectional diagram illustrating a thin-film chalcogenide absorber layer having been formed on the conductive back contact layer(s) according to an embodiment of the present invention.
Figure 3:
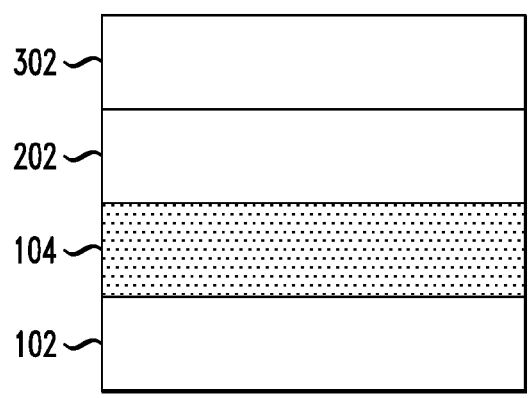
FIG. 3 is a cross-sectional diagram illustrating a buffer layer having been formed on the absorber layer according to an embodiment of the present invention.

Next, as shown in FIG. 2, a thin-film chalcogenide absorber layer 202 is formed on the conductive layer 104. According to an exemplary embodiment, absorber layer 202 has a thickness of from about 0.6 $\mu m$ to about 3.0 $\mu m$, and is composed of a copper-indium-gallium-sulfur/selenium (abbreviated "CIGS") or a copper-zinc-tin-sulfur/selenium (abbreviated "CZTSSe") material. As highlighted above, the various layers of the solar cell may be deposited using any suitable vacuum-based or solution-based approach (such as spin-coating). Optionally absorber layer 202 can be fabricated by stacking a sequence of layers in order to achieve optimal band grading and/or adhesion to the substrate, as is known in the art. See, for example, Dullweber et al., "Back surface band gap gradings in Cu(In,Ga)Se$_2$ solar cells," Thin Solid Films, vol. 387, 11-13 (2001), the contents of which are incorporated by reference herein.

A sulfurization or selenization process may be employed during formation of the absorber layer 202. See, for example, Goushi et al., "Fabrication of Pentanary Cu(InGa)(SeS)$_2$ Absorbers by Selenization and Sulfurization," Solar Energy Materials and Solar Cells, vol. 93, no. 8, pgs. 1318-1320 (2009) (hereinafter Goushi), the contents of which are incorporated by reference herein. It is important to note that this sulfurization/selenization is a different and distinct step from the present low-temperature sulfurization heat treatment process (described below) that is employed to passivate the grain boundaries and interfaces of the absorber layer. Namely, the sulfurization/selenization heat treatment process to form the absorber layer is typically carried out at high-temperatures (e.g., exceeding 300 degrees Celsius (° C.)) and must be conducted before a buffer layer of the device is formed. The reason being that the high-temperatures used for this conventional anneal would negatively affect the p-n heterojunction between the buffer layer and the absorber layer if performed after the buffer layer is formed. By contrast, the low-temperature sulfurization heat treatment described herein is carried out after the buffer layer is formed and serves to passivate the grain boundaries and interfaces on both sides of the absorber layer (see below).

A buffer layer 302 is then formed on the absorber layer 202. See FIG. 3. As highlighted above, the various layers of the device may be deposited using any suitable vacuum-based or solution-based approach. According to an exemplary embodiment, buffer layer 302 is deposited on absorber layer 202 using standard chemical bath deposition to a thickness of from about 50 angstroms (Å) to about 900 Å, e.g., about 700 Å, and is composed of cadmium sulfide (CdS), a cadmium-zinc-sulfur material of the formula $Cd_{1-x}Zn_xS$ (wherein $0<x\leq 1$), an $In_2S_3$ material, a Zn(O,S) or Zn(O,S,OH) material. The buffer layer 302 and the absorber layer 202 form a p-n junction therebetween.

The chalcogenide-based absorber layer 202 is made up of a polycrystalline film. Grain boundaries and interfaces on both sides of the absorber layer (i.e., at an interface between the absorber layer 202 and the Mo layer 104 and at an interface between the absorber layer 202 and the buffer layer 302) are a notable source of charge recombination in these thin-film photovoltaic technologies, thereby reducing device performance.

Thus, mechanisms to passivate the grain boundaries and interfaces are being actively pursued. For example, selenium/sulfur vacancies at the grain boundaries within the chalcogenide absorber layer and at the abovementioned interfaces (due to the volatility of these species) have been reported to provide recombination centers that can reduce performance of the photovoltaic device. An oxygen- or air-based heat treatment (an anneal) at low temperatures (e.g., at less than 250° C.) has been shown to improve device performance as a result of the oxidation-related passivation of the chalcogen vacancies present at the CIGS grain boundaries and interfaces. See, for example, Kronik et al., "Effects of Sodium on Polycrystalline Cu(In,Ga)Se$_2$ and Its Solar Cell Performance," Advanced Materials, vol. 10, no. 1, pgs. 31-36 (1998); Cahen et. al., "Defect Chemical Explanation for the Effect of Air Anneal on CdS/CuInSe$_2$ Solar Cell Performance" Appl. Phys. Lett., vol. 54, pgs. 558-560 (1989); Rau et al., "Oxygenation and Air-Annealing Effects on the Electronic Properties of Cu(In,Ga)Se$_2$ Films and Devices," J. Applied Physics, vol. 86, no. 1, pgs. 497-505 (1999) (hereinafter "Rau 1999"); Sasala et al., "Annealing Effects on Individual Loss Mechanisms in CuInSe$_2$ Solar Cells," Solar Cells, vol. 30, pgs. 101-107 (1991) and Rau et al., "Electronic Properties of ZnO/CdS/Cu(In,Ga)Se$_2$ Solar Cells—Aspects of Heterojunction Formation," Thin Solid Films, vol. 387, pgs. 141-146 (2001) (hereinafter "Rau 2001"). The contents of each of the foregoing are incorporated by reference herein.

Detailed electrical analysis, however, has shown that air annealing also has the potentially detrimental impact of decreasing net doping density. The decrease in doping density has been ascribed to the oxygenation-induced release of copper atoms from the absorber surface and their resulting redistribution as interstitial copper atoms in the volume of the absorber, where the copper atoms can act as compensating donors. See, for example, Rau 1999 and Rau 2001. When using oxygen or air treatment, there is therefore a trade-off between passivating grain boundaries and inducing atom diffusion which can limit device performance. Given these issues with the presently known processes for treating chalcogenide-based absorber layers to passivate grain boundaries and device interfaces, it is desirable to develop more effective processes that can yield higher efficiency devices without adding significant cost to the process.

Figure 4:
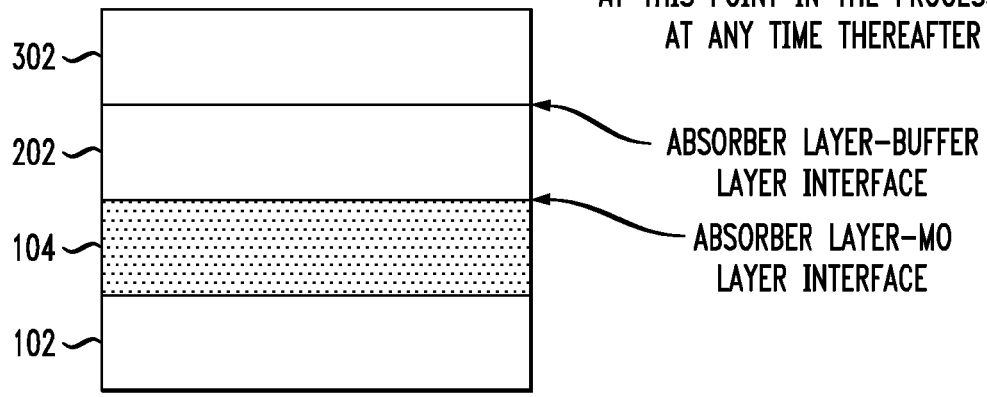
FIG. 4 is a cross-sectional diagram illustrating that a sulfurization heat treatment process used to passivate grain boundaries in the absorber layer can be performed anytime after the buffer layer has been formed according to an embodiment of the present invention.
Figure 5:
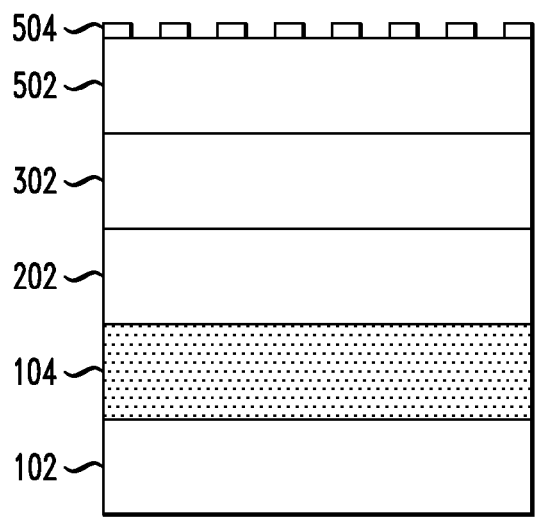
FIG. 5 is a cross-sectional diagram illustrating a transparent front contact and a metal grid having been formed on the buffer layer according to an embodiment of the present invention.

Advantageously, the present techniques employ a unique heat treatment process in a sulfur or selenium-containing atmosphere at a low enough temperature that the p-n junction between the absorber layer 202 and the buffer layer 302 or the absorber material itself is not damaged by diffusion of ions (e.g., copper, cadmium). This sulfurization or selenization heat treatment process serves to effectively passivate the grain boundaries in the chalcogenide absorber layer, without requiring the use of an oxygen treatment that introduces a foreign element (oxygen is not one of the main constituents of CIGS or CZTSSe) and which can lead to the above-described negative doping density effects, and can be performed anytime after the buffer layer has been formed (i.e., the buffer layer should be deposited first such that the absorber layer-buffer layer interface is already formed and can be passivated by the process), e.g., right after formation of the buffer layer 302 (as shown in FIG. 4), after fabrication of all of the device layers has been completed (as shown in FIG. 5), or anytime therebetween. The act of passivation can be achieved by filling chalcogen vacancies in the grain boundaries or bulk of the CZTSSe, CIGS or buffer layer (e.g., CdS) films. These vacancies can arise because of the volatility of the chalcogens at the high temperature (greater than 400° C.) used for the final heat treatment during the process of depositing the absorber layer or from imperfections introduced during the chemical bath deposition of the buffer layer. Additionally, this filling of vacancies can occur at the interface between the CZTSSe or CIGS absorber layer and the buffer layer.

The present sulfurization or selenization heat treatment process is effective at the passivation of not only the absorber layer, but also the various other interfaces and layers in the device (i.e., the present sulfurization or selenization heat treatment causes slight changes in the stoichiometry of these layers, such as filling of oxygen vacancies with chalcogen atoms or replacement of oxygen atoms with chalcogen atoms, which could impact the series resistance of the device, as well as the open circuit voltage and short circuit current). The various interfaces in the device that can be passivated using the present process include absorber layer 102/conductive layer 104 (i.e., back contact) interface, absorber layer 102/buffer layer 302 interface and buffer layer 302/transparent front contact (see below) interface. The various layers in the device that can be passivated using the present process include the absorber layer 102, the buffer layer 302 and the transparent front contact. For example, filling chalcogen vacancies in the absorber layer and/or buffer layer (and/or at the interface therebetween) can remove potential trap states that can lead to undesirable recombination. Chalcogen treatment (i.e., sulfurization or selenization) of the buffer layer and/or transparent front contact can modify the chalcogen content of these layers, thereby potentially beneficially influencing the electronic properties of these layers. Therefore, ideally, the present sulfurization or selenization heat treatment process is performed after the device is completed (i.e., after all of layers of the device have been formed, see FIG. 5, described below). According to an exemplary embodiment, the present low temperature treatment process involves heating the device to a temperature of less than about 300° C., e.g., from about 120° C. to about 300° C., for a duration of from about 0.1 minutes to about 60 minutes in the presence of a chalcogen-containing, e.g., sulfur-containing and/or selenium-containing vapor. The temperature should be maintained below about 300° C. during the treatment process to avoid layer inter-diffusion between the buffer layer and the absorber layer (or within the absorber layer) as a result of the treatment. For example, if temperatures above 300° C. are used, then inter-diffusion of the buffer layer and absorber layer materials can occur, potentially forming mixed 'inter-diffusion' regions that extend as far into the respective layer (s) as from about 2 nanometers (nm) to about 50 nm. This inter-diffusion could deteriorate the heterojunction properties. For the same reason, the time for the process should be quite short (up to about 60 minutes). Following the heat treatment, the device is cooled to room temperature.

When a sulfur-containing vapor is used, the sulfur-containing vapor can be in the form of elemental sulfur vapors, e.g., S6, S7, S8. See, for example, Steudel et al., "Speciation and Thermodynamics of Sulfur Vapor," in Topics in Current Chemistry pgs. 117-134 (vol. 230), Springer Berlin/Heidelberg (2003), the contents of which are incorporated by reference herein. Alternatively, the sulfur-containing vapor can be in the form of a sulfur compound such as hydrogen sulfide ($H_2S$), thiourea ($SC(NH2)_2$) and related organic sulfur compounds. According to an exemplary embodiment, the treatment atmosphere includes nitrogen or another processing gas such as argon, helium or forming gas (i.e., a hydrogen/nitrogen gas mixture as known in the art) and elemental sulfur vapor or an alternative sulfurization agent (such as $H_2S$). When a selenium-containing vapor is used, the selenium-containing vapor can be in the form of hydrogen selenide ($H_2Se$).

Compared to the oxygen treatment previously described, the advantage of the current process for grain boundary/interfacial passivation is that the current process does not involve introduction of foreign elements, such as oxygen, into the already multinary absorber layer system, which typically contains 4-8 elements such as copper, indium, gallium, zinc, tin, sulfur, selenium, sodium and/or antimony. In contrast to the absorber sulfur/selenium element, oxygen introduced by the standard air anneal can have a combination of positive and negative consequences such as forming highly resistive oxides with multiple elements from the absorber layer. Therefore with the present techniques the abovementioned positive effects to air anneal are achieved without the potentially negative consequences of excessive oxidation of device constituents.

Note, additionally, that the substitution of sulfur (smaller molecules) for selenium (larger molecules) in a selenium-containing CIGS or CZTSSe layer, which can occur during the present heat treatment when sulfur vapor is employed, is expected to increase the band gap. Therefore, the present heat treatment may also increase the operating voltage of the device which is desirable for large scale operation. Namely, increasing the operating voltage of the device may be beneficial for reducing series resistance losses in large-area photovoltaic modules. Therefore the anneal of a selenium-containing absorber layer in a sulfur atmosphere as taught herein, which can lead to the replacement of some selenium with sulfur, can lead to an increase in absorber band gap.

It is notable that a number of sulfurization and selenization processes have been described previously. See, for example, Goushi. However, these sulfurization and selenization processes generally all require heat-treating the absorber layer film in the presence of sulfur or selenium compounds at elevated temperatures (above 300° C.) and, due to these high temperatures, must be performed before the application of the buffer layer in the device fabrication process. By contrast, the present sulfurization or selenization heat treatment is performed after depositing the buffer layer and preferably after the entire device is completed. This enables the sulfurization or selenization treatment to facilitate the passivation of, not only the absorber layer, but also the various interfaces in the device. Also, care must be taken during the process to avoid damaging the p-n junction between the absorber layer and the buffer layer. To do so, the temperatures employed are kept less than or equal to about 300° C.

It is important to note that the above described sulfurization or selenization heat treatment does not preclude the possibility of also using one or more other heat treatment processes in addition to the present sulfurization or selenization heat treatment process. By way of example only, one or more other low-temperature thermal treatments, such as oxygen annealing, may be conducted before and/or after the sulfurization/selenization heat treatment. The idea is that a combination of introducing oxygen and sulfur/selenium might yield a better passivated grain boundary or a preferable effect on the device layers as opposed to a single gas treatment. According to an exemplary embodiment, a low temperature annealing (e.g., at a temperature of less than about 240° C., e.g., from about 120° C. to about 240° C., for a duration of from about 0.1 minutes to about 60 minutes) in air or oxygen is performed prior to the present sulfurization or selenization heat treatment.

Next, as shown in FIG. 5, a transparent front contact 502 is formed on the buffer layer 302. As highlighted above, the various layers of the device may be deposited using any suitable vacuum-based or solution-based approach. According to an exemplary embodiment, transparent front contact 502 is deposited on the buffer layer 302 using sputtering to a thickness of from about 1,000 Å to about 10,000 Å, e.g., about 2,500 Å, and is composed of a bilayer of intrinsic and aluminum-doped zinc oxide (ZnO) as a transparent conductive oxide (TCO) or indium-tin-oxide (ITO). Finally, optionally, a metal grid 504 (which is often used to help collect the current generated by the cell) is formed on top of the transparent front contact 502. According to an exemplary embodiment, the metal grid 504 is deposited on the transparent front contact 502 using electron-beam (e-beam) evaporation and is composed of nickel and aluminum. As is known in the art, adding a metal grid to the transparent front contact helps to reduce the series resistance of the cell and therefore improve the fill factor of the device. Optionally, an antireflection coating (not shown) may be deposited on the metal grid 504. According to an exemplary embodiment, the antireflection coating is deposited on the metal grid 504 using e-beam evaporation to a thickness of from about 90 nm to about 150 nm (e.g., about 110 nm) and is composed of magnesium fluoride ($MgF_2$).

As highlighted above, while the sulfurization or selenization heat treatment process may be performed at any time after placement of the buffer layer, it is preferably performed at this point in the process, i.e., once all of the layers of the device have been formed. That way, passivation of the various other interfaces and layers in the device can also be achieved.

Photovoltaic devices prepared according to the above-described method exhibit increased performance as compared with conventional devices. Specifically, using the above process, the power conversion efficiency of the present solution-processed CIGS devices has been improved to 14.3% (see below), higher than can be achieved with an oxygen-based treatment alone.

The present invention further provides a photovoltaic module which includes a plurality of electrically interconnected photovoltaic devices produced according to the present techniques. In particular, the module may be monolithically integrated using processes well known to those skilled in the art (as an example, see M. Powalla et al., "Large-Area CIGS Modules: Pilot Line Production and New Developments," International PVSEC-14, Bangkok, Thailand, Jan. 26-30, 2004; 1N28V/18-1, (hereinafter "Powalla"), the contents of which are incorporated by reference herein). By way of example only, photovoltaic modules can include a plurality of photovoltaic devices (produced using the present techniques) that are interconnected in series as discrete devices with wiring or monolithically on a single substrate by three isolation cuts of (i) the conductive material, (ii) absorber and buffer and (iii) the transparent front contact. Suitable techniques for isolating cells for large-area module fabrication, including the steps for performing the isolating cuts, is provided in Powalla.

The present techniques are further described by way of reference to the following non-limiting examples.

Example 1

Film Preparation

Hydrazine solution preparation and spin-coating were performed in a nitrogen-filled glove box, following procedures described in D. B. Mitzi et al., "A High-Efficiency Solution-Deposited Thin-Film Photovoltaic Device," Adv. Mater. 20, pgs. 3657-3662 (2008), the contents of which are incorporated by reference herein. Two molybdenum-coated glass substrates (samples A and B) were spin-coated at 800 revolutions per minute (rpm), first with a thinner base layer for improved adhesion formed from a 0.3 molar (M) Cu(In,Ga)(S,Se)$_2$ solution, followed by three layers formed from a concentrated 1.1M Cu(In,Ga)(S,Se)$_2$ solution. All of the layers, except the last one, were annealed on a hot plate for 1 minute at 425° C. and the final stack of layers was annealed for 5 minutes at 540° C.

CdS buffer layers were deposited onto each sample by standard chemical bath deposition, followed by sputtered ZnO and a conductive indium-doped tin oxide layer to form transparent front contacts. A nickel-aluminum collection grid and 110-nm-thick magnesium fluoride antireflection coating were deposited on top of the device by e-beam evaporation. Each device had a total area (including grid) of approximately 0.45 square centimeters (cm$^2$). Sample A was annealed in air for 4 minutes at 180° C. before sulfurization, while sample B was subjected to sulfurization directly. Sulfurizations (S-anneals or S-an) were performed at 200° C. for two minutes at atmospheric pressure in the presence of elemental sulfur vapor with equilibrium concentration for said temperature and pressure. This pressure was maintained by heating the substrates on a temperature-controlled hot plate and using a quartz cover to maintain the partial pressure of sulfur (introduced as elemental S placed under the cover).

FIG. 6 is a table 600 illustrating performance of the solar cell samples A and B from Example 1. Specifically, the two samples A and B were successively subjected to conditions 1), 2) and 3) and measured in between. As indicated in table 600, marked improvement in efficiency (Eff) was observed in devices subjected to the S-anneals. For the previously air-annealed sample A the subsequent sulfurization treatment produced additional efficiency enhancement by 1.26 absolute %, reaching 14.34% with antireflection coating ($MgF_2$). For a device that was not previously subjected to air anneal (sample B), the improvement is by 5.6 absolute %, reaching 14.32% with antireflection coating. Besides efficiency (Eff), the S-anneal also increased the open-circuit voltages (Voc) by 9 millivolts (mV) or 23 mV and the fill factor (FF) by 3.3% and 27.5%, respectively, for the air-annealed sample and the previously untreated sample after the S-anneal. Notably this increase in voltage did not cause a decrease in the short-circuit current (Jsc), which was also improved due to lower series resistance (assessed by R-Voc) and potentially reduced recombination.

Example 2

Film Preparation

Hydrazine solution preparation and spin-coating were performed in a nitrogen-filled glove box, following procedures described in T. Todorov et al., "High-Efficiency Solar Cell with Earth-Abundant Liquid-Processed Absorber," Adv. Mater. 22, E156-E159 (2010) (hereinafter "Todorov"), the contents of which are incorporated by reference herein. Two molybdenum-coated glass substrates (samples C and D) were each spin-coated at 800 rpm with 5 layers of 0.4 M $Cu_2ZnSn(S,Se)_4$ slurry as described in U.S. Patent Application Publication No. 2011/0094557 A1 and U.S. Patent Application Publication No. 2011/0097496 A1. All of the layers, except the last one, were annealed on a hot plate for 1 minute at 425° C. and the final stack of layers was annealed for 10 minutes at 540° C.

CdS buffer layers were deposited onto each sample by standard chemical bath deposition, followed by sputtered ZnO, and a conductive indium-doped tin oxide layer to form transparent front contacts. A nickel-aluminum collection grid and 110-nm-thick magnesium fluoride antireflection coating were deposited on top of the device by e-beam evaporation. Each device had a total area (including grid) of approximately 0.45 $cm^2$. Anneals in air were performed for 4 minutes at 180° C. Sulfurization anneals with $H_2S$ ($H_2S$-anneals) were performed for two minutes at 220° C. at atmospheric pressure in atmosphere containing approximately 20% $H_2S$.

FIG. 7 is a table 700 illustrating performance of the solar cell samples from Example 2. As indicated in table 700, marked improvement in efficiency (Eff) was observed in solar cells subjected to the $H_2S$-anneals (3.4 absolute %) as compared to samples wherein neither an $H_2S$-anneal nor an air anneal was performed (as deposited) as well as compared to samples with air anneals (1.7 absolute %).

Example 3

Film Preparation

Hydrazine solution preparation and spin-coating were performed in a nitrogen-filled glove box, following procedures described in Todorov. A molybdenum-coated glass substrate (sample E) was spin-coated at 800 rpm with 5 layers of 0.4 M $Cu_2ZnSn(S,Se)_4$ slurry as described in U.S. Patent Application Publication No. 2011/0094557 A1 and U.S. Patent Application Publication No. 2011/0097496 A1. All of the layers, except the last one, were annealed on a hot plate for 1 minute at 425° C. and the final stack of layers was annealed for 10 minutes at 540° C.

A CdS buffer layer was deposited onto the sample by standard chemical bath deposition, followed by sputtered ZnO, and a conductive indium-doped tin oxide layer to form transparent front contacts. A nickel-aluminum collection grid and 110-nm-thick magnesium fluoride antireflection coating were deposited on top of the device by e-beam evaporation. The device had a total area (including grid) of approximately 0.45 $cm^2$. Measurements were taken before annealing and then after an anneal in 20% $H_2Se$ gas at 220° C. for 2 minutes.

Figures 8, 9:
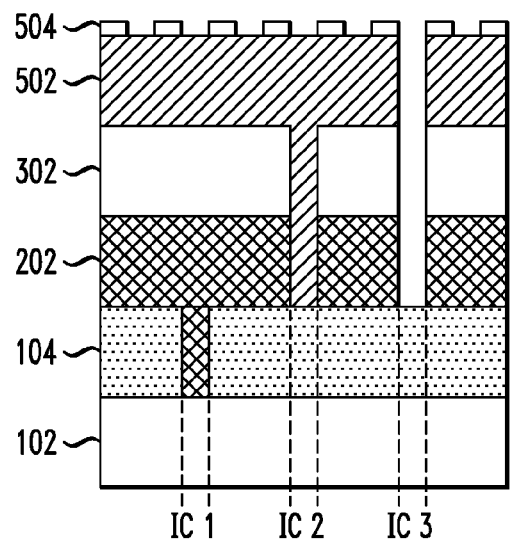
FIG. 8 is a table illustrating performance of a solar cell sample prepared using the present heat treatment in the presence of hydrogen selenide vapor according to an embodiment of the present invention.
FIG. 9 is a cross-sectional diagram illustrating a photovoltaic module formed using the present techniques according to an embodiment of the present invention.

FIG. 8 is a table 800 illustrating performance of the solar cell sample from Example 3. As indicated in table 800, marked improvement in efficiency (Eff) from 5.99% to 8.49% was observed.

Further, as highlighted above, the present techniques can be used to form a photovoltaic module. Specifically, as shown in FIG. 9, isolation cuts IC1-IC3 (see, for example, Powalla) have been made through (i) the conductive material (IC1), (ii) absorber and buffer (IC2) and (iii) the transparent front contact (IC3) of the structure shown, for example, in FIG. 5, to produce photovoltaic module 900. Further, cross-hatching has been added to illustrate that the absorber layer 202 goes all the way down to the substrate 102 within the isolation cut IC1 and that the transparent front contact 502 goes all the way down to the Mo layer 104 within the isolation cut IC2.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for fabricating a photovoltaic device, comprising the steps of:
   providing a substrate that is either (i) formed from an electrically conductive material or (ii) coated with at least one layer of a conductive material;
   forming a chalcogenide absorber layer on the substrate;
   forming a buffer layer on the absorber layer;
   forming a transparent front contact on the buffer layer; and
   contacting the device with a chalcogen-containing vapor comprising at least one of a sulfur compound and a selenium compound, wherein the absorber layer and the buffer layer are formed prior to contacting the device with the chalcogen-containing vapor such that the substrate, the absorber layer, the buffer layer and interfaces therebetween are present and can be passivated by the contacting step, and wherein the contacting step is performed under conditions sufficient to improve device performance by filling chalcogen vacancies within the absorber layer or the buffer layer or by passivating one or more of grain boundaries in the absorber layer and the interfaces between the substrate, the absorber layer, and the buffer layer.

2. The method of claim 1, wherein the conductive material comprises molybdenum.

3. The method of claim 1, wherein the conditions comprise a temperature and a duration.

4. The method of claim 3, wherein the temperature is from about 120° C. to about 300° C.

5. The method of claim 3, wherein the temperature is from about 120° C. to about 240° C.

6. The method of claim 3, wherein the duration is from about 0.1 minutes to about 60 minutes.

7. The method of claim 1, wherein the chalcogen-containing vapor comprises the sulfur compound, and wherein the sulfur compound comprises elemental sulfur.

8. The method of claim 7, wherein the elemental sulfur is S6, S7 or S8.

9. The method of claim 1, wherein the chalcogen-containing vapor comprises the sulfur compound, and wherein the sulfur compound comprises hydrogen sulfide.

10. The method of claim 1, wherein the chalcogen-containing vapor comprises the selenium compound, and wherein the selenium compound comprises hydrogen selenide.

11. The method of claim 1, wherein the substrate comprises at least one of glass, metal and plastic.

12. The method of claim 1, wherein the chalcogenide absorber layer comprises a copper-indium-gallium-sulfur/selenium material.

13. The method of claim 1, wherein the chalcogenide absorber layer comprises a copper-zinc-tin-sulfur/selenium material.

14. The method of claim 1, wherein the transparent front contact is composed of intrinsic and aluminum-doped zinc oxide (ZnO) or indium-tin-oxide ITO.

15. The method of claim 1, wherein the transparent front contact has a thickness of from about 1,000 angstroms to about 10,000 angstroms.

16. The method of claim 1, further comprising the step of:
forming a metal grid on the transparent front contact.

17. The method of claim 1, wherein the absorber layer, the buffer layer, and the transparent front contact are formed prior to contacting the device with the chalcogen-containing vapor such that the substrate, the absorber layer, the buffer layer, the transparent front contact and interfaces therebetween can be passivated by the contacting step.

* * * * *